United States Patent
Hara et al.

(10) Patent No.: US 12,010,793 B2
(45) Date of Patent: Jun. 11, 2024

(54) CERAMIC CIRCUIT BOARD, CERAMIC GREEN SHEET FOR CERAMIC CIRCUIT BOARD, AND GLASS CERAMIC POWDER FOR CERAMIC CIRCUIT BOARD

(71) Applicant: NIPPON ELECTRIC GLASS CO., LTD., Otsu (JP)

(72) Inventors: Hiroaki Hara, Otsu (JP); Shuji Nakazawa, Otsu (JP)

(73) Assignee: NIPPON ELECTRIC GLASS CO., LTD., Otsu (JP)

( * ) Notice: Subject to any disclaimer, the term of this patent is extended or adjusted under 35 U.S.C. 154(b) by 5 days.

(21) Appl. No.: 17/632,590

(22) PCT Filed: Jul. 30, 2020

(86) PCT No.: PCT/JP2020/029318
§ 371 (c)(1),
(2) Date: Feb. 3, 2022

(87) PCT Pub. No.: WO2021/024918
PCT Pub. Date: Feb. 11, 2021

(65) Prior Publication Data
US 2022/0279649 A1    Sep. 1, 2022

(30) Foreign Application Priority Data
Aug. 6, 2019   (JP) ................. 2019-144372

(51) Int. Cl.
*H05K 1/03*        (2006.01)
*C03C 14/00*       (2006.01)

(52) U.S. Cl.
CPC ......... *H05K 1/0306* (2013.01); *C03C 14/004* (2013.01); *C03C 2214/04* (2013.01)

(58) Field of Classification Search
None
See application file for complete search history.

(56) References Cited

U.S. PATENT DOCUMENTS

2001/0029228 A1*  10/2001  Terashi .............. C03C 10/0054
                                                    501/153
2002/0091058 A1*   7/2002  Umayahara ............. C03C 8/14
                                                    501/5
(Continued)

FOREIGN PATENT DOCUMENTS

CN    105579418 A    5/2016
JP    2009-074823 A  4/2009
(Continued)

OTHER PUBLICATIONS

International Search Report dated Oct. 27, 2020 for PCT/JP2020/029318.
(Continued)

*Primary Examiner* — Seth Dumbris
(74) *Attorney, Agent, or Firm* — Faegre Drinker Biddle & Reath LLP

(57) ABSTRACT

A ceramic circuit board includes: a ceramic board; and an internal conductor disposed in the ceramic board, in which the ceramic board contains glass, a willemite filler, and an alumina filler, and an average particle diameter of the willemite filler is larger than an average particle diameter of the alumina filler.

8 Claims, 1 Drawing Sheet

(56) References Cited

U.S. PATENT DOCUMENTS

2016/0122231 A1* 5/2016 Ishihara .................. C03C 3/089
501/17
2017/0036945 A1* 2/2017 Ishihara .................. C03C 3/093

FOREIGN PATENT DOCUMENTS

| JP | 2015-092541 A | 5/2015 |
| TW | I634091 B | 9/2018 |

OTHER PUBLICATIONS

Written Opinion of the International Searching Authority dated Oct. 27, 2020 for PCT/JP2020/029318.
Office Action dated Apr. 18, 2022 in Taiwanese Patent Application No. 109126337 (5 pages) with an English translation (4 pages).
First Office Action dated Nov. 30, 2023 in Chinese Application No. 202080056430.9.

* cited by examiner

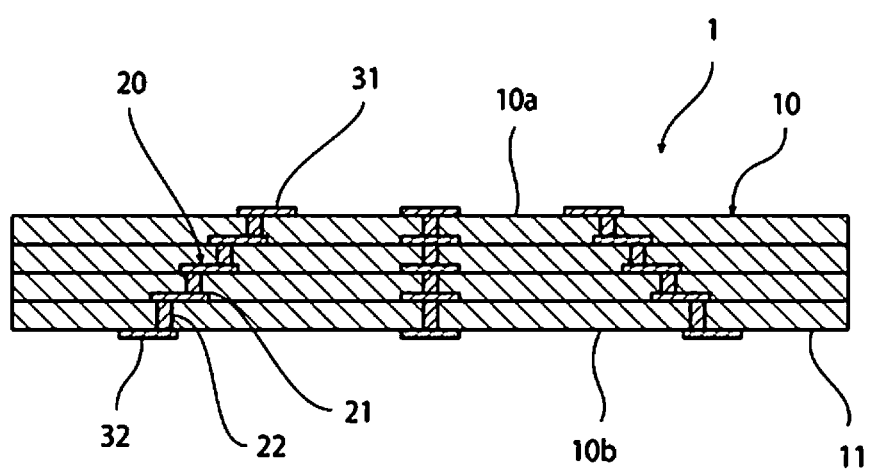

CERAMIC CIRCUIT BOARD, CERAMIC GREEN SHEET FOR CERAMIC CIRCUIT BOARD, AND GLASS CERAMIC POWDER FOR CERAMIC CIRCUIT BOARD

TECHNICAL FIELD

The present invention relates to a ceramic circuit board, a ceramic green sheet for a ceramic circuit board, and a glass ceramic powder for a ceramic circuit board.

BACKGROUND ART

In related art, when inspecting a semiconductor wafer, a probe card is disposed on the semiconductor wafer, and the semiconductor wafer is electrically connected to a tester via the probe card. The probe card generally includes a test head that comes into contact with a semiconductor wafer, a printed ceramic circuit board that is connected to a tester, and a ceramic circuit board called an interposer board that connects the printed ceramic circuit board and the test head.

For example, Patent Literature 1 describes a ceramic circuit board formed of low-temperature fired ceramics containing glass as a ceramic circuit board that can be fired at a low temperature.

CITATION LIST

Patent Literature

Patent Literature 1: JP-A-2009-074823

SUMMARY OF INVENTION

Technical Problem

A distance between electrode pads of the printed ceramic circuit board is larger than a distance between electrode pads of the test head. Electrode pads corresponding to the electrode pads of the printed ceramic circuit board are provided on a main surface on one side of the interposer board, and electrode pads corresponding to the electrode pads of the test head are provided on a main surface on the other side. The electrode pad on the one main surface side and the electrode pad on the other main surface side are connected to each other by an internal conductor. Therefore, in the interposer board, it is important that the positional accuracy of the electrode pads on both main surfaces is high.

In addition, the inspection using the probe card is performed in a wide temperature range of, for example, −40° C. to +125° C. Therefore, it is preferable to make a thermal expansion coefficient of the interposer board approximate to a thermal expansion coefficient of the test head or the printed ceramic circuit board such that there is no difference between the distance between the electrode pads of the interposer board and the distance between the electrode pads of the test head or the printed ceramic circuit board when the inspection temperature changes. Therefore, the interposer board is preferably formed of a material whose thermal expansion coefficient can be adjusted in accordance with the use environment.

Generally, the thermal expansion coefficient of the test head is made approximate to the thermal expansion coefficient of the semiconductor wafer. For this reason, there is also a demand for lowering the thermal expansion coefficient of the interposer board to about the thermal expansion coefficient of the semiconductor wafer.

However, the ceramic circuit board described in Patent Literature 1 has a problem in that it is difficult to achieve a thermal expansion coefficient that is as low as the thermal expansion coefficient of the semiconductor wafer.

Further, there is also a demand for ensuring the mechanical strength of the interposer board.

A main object of the present invention is to provide a ceramic circuit board that can be fired at a low temperature, whose thermal expansion coefficient can be adjusted to be low, and which has high mechanical strength.

Solution to Problem

A ceramic circuit board of the present invention includes a ceramic board and an internal conductor disposed in the ceramic board. The ceramic board contains glass, a willemite filler, and an alumina filler. An average particle diameter of the willemite filler is larger than an average particle diameter of the alumina filler. Here, "willemite" is a silicon-zinc composite oxide, and is generally represented by $ZnSiO_4$. The "average particle diameter" is defined by D50, which is calculated based on a volume of particles when a particle diameter of any powder is measured by a laser diffraction scattering method.

In the ceramic circuit board of the present invention, the ceramic board preferably contains, in terms of mass %, 30% to 65% of glass, 14% to 56% of a willemite filler, and 7% to 42% of an alumina filler.

In the ceramic circuit board of the present invention, the glass is preferably borosilicate glass.

In the ceramic circuit board of the present invention, the borosilicate glass preferably contains, as a glass composition, in terms of mass %, 60% to 80% of $SiO_2$, 10% to 30% of $B_2O_3$, 1% to 5% of $Li_2O+Na_2O+K_2O$, and 0% to 20% of $MgO+CaO+SrO+BaO$. Here, "$Li_2O+Na_2O+K_2O$" means the total amount of $Li_2O$, $Na_2O$, and $K_2O$. "$MgO+CaO+SrO+BaO$" means the total amount of MgO, CaO, SrO, and BaO.

A ceramic green sheet for a ceramic circuit board of the present invention contains, in terms of mass %, 30% to 65% of a glass powder, 14% to 56% of a willemite filler, and 7% to 42% of an alumina filler. An average particle diameter of the willemite filler is larger than an average particle diameter of the alumina filler.

A glass ceramic powder for a ceramic circuit board of the present invention contains, in terms of mass %, 30% to 65% of a glass powder, 14% to 56% of a willemite filler, and 7% to 42% of an alumina filler. An average particle diameter of the willemite filler is larger than an average particle diameter of the alumina filler.

Advantageous Effects of Invention

According to the present invention, it is possible to provide a ceramic circuit board that can be fired at a low temperature, whose thermal expansion coefficient can be adjusted to be low, and which has high mechanical strength.

BRIEF DESCRIPTION OF DRAWINGS

FIG. 1 is a schematic cross-sectional view of a ceramic circuit board according to an embodiment of the present invention.

DESCRIPTION OF EMBODIMENTS

Hereinafter, an example of a preferred embodiment of the present invention is described. However, the following embodiment is merely illustrative. The present invention is not limited to the following embodiment.

FIG. 1 is a schematic cross-sectional view of a ceramic circuit board according to the present embodiment. A ceramic circuit board 1 shown in FIG. 1 can be used as a ceramic circuit board that is required to have a low thermal expansion coefficient and high mechanical strength. The ceramic circuit board 1 can be used as, for example, an interposer board of a probe card.

The ceramic circuit board 1 includes a ceramic board 10. The ceramic board 10 has first and second main surfaces 10a and 10b. The ceramic board 10 is formed by a laminated body of plural ceramic layers 11.

Plural internal conductors 20 are disposed inside the ceramic board 10. Each of the internal conductors 20 includes an interlayer electrode 21 that is located between adjacent ceramic layers 11, and a via hole electrode 22 that penetrates the ceramic layer 11 and connects the interlayer electrodes 21 facing each other in a laminating direction of the ceramic layers 11 through the ceramic layer 11.

Plural internal conductors 20 are provided across the first main surface 10a and the second main surface 10b of the ceramic board 10. An end portion of the internal conductor 20 on a first main surface 10a side is connected to an electrode pad 31 provided on the first main surface 10a. An end portion of the internal conductor 20 on a second main surface 10b side is connected to an electrode pad 32 provided on the second main surface 10b.

A distance between the electrode pads 32 adjacent to each other on the second main surface 10b is longer than a distance between the electrode pads 31 adjacent to each other on the first main surface 10a. Therefore, when the ceramic circuit board 1 is used as an interposer board, a test head is connected to the first main surface 10a side, and a printed ceramic circuit board is connected to the second main surface 10b side.

The internal conductor 20 and the electrode pads 31 and 32 can be formed of an appropriate conductive material. Each of the internal conductor 20 and the electrode pads 31 and 32 may be formed of, for example, at least one metal such as Pt, Au, Ag, Cu, Ni, or Pd.

The ceramic board 10 preferably contains glass, a willemite filler, and an alumina filler. Specifically, the ceramic board 10 contains, in terms of mass %, 30% to 65% of glass, 14% to 56% of a willemite filler, and 7% to 42% of an alumina filler. In the following description of the content, "%" means "mass %" unless otherwise specified.

The glass increases the denseness (relative density) and mechanical strength of the ceramic board 10. The content of the glass is preferably 30% to 65%, and particularly preferably 30% to 50%. When the content of the glass is too small or too large, it is difficult to obtain a desired thermal expansion coefficient and mechanical strength.

The willemite filler decreases the thermal expansion coefficient of the ceramic board 10. The content of the willemite filler is preferably 14% to 56%, and particularly preferably 20% to 40%. When the content of the willemite filler is too small or too large, it is difficult to obtain a desired thermal expansion coefficient and mechanical strength.

The alumina filler increases the mechanical strength of the ceramic board 10. The content of the alumina filler is preferably 7% to 42%, and particularly preferably 20% to 40%. When the content of the alumina filler is too small or too large, it is difficult to obtain a desired thermal expansion coefficient and mechanical strength.

The average particle diameter of the willemite filler is larger than the average particle diameter of the alumina filler, and is particularly preferably 1.2 times or more the average particle diameter of the alumina filler. When the average particle diameter of the willemite filler is smaller than the average particle diameter of the alumina filler, the willemite filler and the alumina filler react with each other at the time of firing, and gahnite is easily precipitated. As a result, it is difficult to control the thermal expansion coefficient of the ceramic board 10 within a desired range.

The average particle diameter of the willemite filler is preferably 2 μm to 5 μm, and particularly preferably 2 μm to 3 μm. When the average particle diameter of the willemite filler is too small, microcracks in a crystal grain boundary due to anisotropic expansion of crystal grains are reduced, and the thermal expansion coefficient of the willemite filler tends to increase. As a result, it is difficult to control the thermal expansion coefficient of the ceramic board 10 within a desired range. On the other hand, when the average particle diameter of the willemite filler is too large, the mechanical strength of the ceramic board 10 is liable to lower.

The thermal expansion coefficient of the ceramic board 10 is preferably 4 ppm/°C. or less, and particularly preferably 3.6 ppm/°C. or less in a temperature range of −40°C. to +125°C. When the thermal expansion coefficient of the ceramic board is too high, the thermal expansion coefficient of the ceramic board becomes higher than that of the semiconductor wafer, and it becomes difficult to accurately inspect the semiconductor wafer. A lower limit of the thermal expansion coefficient is not particularly limited, but is preferably 3 ppm/°C. or more in practice.

The thermal expansion coefficient of the ceramic board in the temperature range of −40°C. to +125°C. in the present specification is measured by a method in accordance with JIS R3102.

The three-point bending strength of the ceramic board 10 is preferably 100 MPa or more, and particularly preferably 150 MPa or more. When the three-point bending strength is too low, the ceramic board 10 is likely to be damaged. An upper limit of the three-point bending strength is not particularly limited, but is preferably 600 MPa or less in practice.

The three-point bending strength of the ceramic board in the present specification is measured by a method in accordance with JIS R1601.

The thermal expansion coefficient of the ceramic filler in the present specification in the temperature range of −40°C. to +125°C. is measured by a method in accordance with JIS R3102 using a sheet-shaped sintered body produced by the following method. The three-point bending strength of the ceramic filler in the present specification is measured by a method in accordance with JIS R1601 using a sheet-shaped sintered body produced by the following method.

The sheet-shaped sintered body used for the measurement of the thermal expansion coefficient and the three-point bending strength of the ceramic filler is produced by the following method.

First, 15 parts by mass of polyvinyl butyral (PVB), 3 parts by mass of benzyl butyl phthalate, and 50 parts by mass of toluene are mixed and kneaded with 100 parts by mass of the ceramic filler having an average particle diameter of 2 μm (such as a willemite filler and an alumina filler) to prepare a slurry. Next, the slurry is formed into a circular sheet shape having a diameter of 20.32 cm (8 inches) and a thickness of 150 μm by a doctor blade method to prepare a green sheet. Next, 30 green sheets are laminated, thermally compressed at 90°C. and 30 MPa, degreased by heat treatment at 450°C., and then sintered at 1600°C. to produce a sintered body.

Finally, the sintered body is polished to a thickness of 3.0 mm to obtain a sheet-shaped sintered body.

The ceramic board 10 may contain three or more types of ceramic fillers. That is, a ceramic filler other than the willemite filler and the alumina filler may be contained.

In this case, it is preferable that the willemite filler has the lowest thermal expansion coefficient among three or more types of ceramic fillers in the temperature range of −40° C. to +125° C., and the alumina filler has the highest three-point bending strength among three or more types of ceramic fillers.

The glass in the ceramic board 10 is preferably borosilicate glass. By using the borosilicate glass, it is easy to decrease the thermal expansion coefficient of the ceramic board 10. In addition, it is possible to increase the mechanical strength of the ceramic board 10.

Specifically, the borosilicate glass preferably contains, as a glass composition, in terms of mass %, 60% to 80% of $SiO_2$, 10% to 30% of $B_2O_3$, 1% to 5% of $Li_2O+Na_2O+K_2O$, and 0% to 20% of $MgO+CaO+SrO+BaO$. In the following description of the content, "%" means "mass %" unless otherwise specified.

$SiO_2$ is a component that forms a network of glass. The content of $SiO_2$ is preferably 60% to 80%. When the content of $SiO_2$ is small, vitrification may be difficult. On the other hand, when the content of $SiO_2$ is large, the melting temperature is increased, and melting may become difficult. The content of $SiO_2$ is more preferably in the range of 65% to 75%.

$B_2O_3$ is a component that forms a network of glass, expands a vitrification range, and stabilizes the glass. The content of $B_2O_3$ is preferably 10% to 30%. When the content of $B_2O_3$ is small, the melting temperature is increased, and melting tends to be difficult. On the other hand, when the content of $B_2O_3$ is large, the thermal expansion coefficient of the ceramic board 10 tends to increase. The content of $B_2O_3$ is more preferably in the range of 15% to 25%.

Alkali metal oxides ($Li_2O$, $Na_2O$, $K_2O$) are components that decrease the viscosity of molten glass and facilitate melting. The content (total amount) of the alkali metal oxides is preferably 1% to 5%. When the content of the alkali metal oxides is small, the effect of decreasing the viscosity may be decreased. On the other hand, when the content of the alkali metal oxides is large, the hydrolytic resistance tends to decrease. The content of the alkali metal oxides is more preferably in the range of 2% to 4%.

Alkaline earth metal oxides (MgO, CaO, SrO, BaO) are components that decrease the viscosity of molten glass and facilitate melting. The content (total amount) of the alkaline earth metal oxides is preferably 0% to 20%. When the content of the alkaline earth metal oxides is large, the glass tends to be unstable, and the glass tends to be devitrified when the glass is melted. The content of the alkaline earth metal oxides is more preferably in the range of 5% to 15%.

Next, a method for manufacturing the ceramic circuit board 1 is described.

First, a glass ceramic powder for a ceramic circuit board containing, in terms of mass %, 30% to 65% of glass, 14% to 56% of a willemite filler, and 7% to 42% of an alumina filler is prepared. As described above, the average particle diameter of the willemite filler is larger than the average particle diameter of the alumina filler.

The glass is preferably borosilicate glass having the above composition, and the average particle diameter of the glass powder is preferably 1 μm to 5 μm.

Next, a binder containing a resin, a plasticizer, a solvent, and the like is added to the glass ceramic powder for a ceramic circuit board and kneaded to prepare a slurry. The slurry is formed into a sheet shape by a doctor blade method or the like to produce a ceramic green sheet for a ceramic circuit board containing glass, a willemite filler, and an alumina filler.

Next, via holes are formed in the ceramic green sheet. The via holes can be formed by, for example, laser light irradiation, mechanical punching, or the like.

Next, the inside of the formed via holes is filled with a conductive paste for forming the via hole electrode 22. A conductive paste for forming the interlayer electrode 21 and the electrode pads 31 and 32 is applied onto the ceramic green sheet.

Thereafter, the ceramic green sheets are appropriately laminated to obtain a laminated body. The laminated body is fired to complete the ceramic circuit board 1.

EXAMPLE

Hereinafter, the present invention will be described in more detail based on specific examples, but the present invention is not limited to the following examples.

Table 1 shows Examples (Sample Nos. 1 to 6) and Comparative Example (Sample No. 7) of the present invention.

TABLE 1

|  |  | No. 1 | No. 2 | No. 3 | No. 4 | No. 5 | No. 6 | No. 7 |
|---|---|---|---|---|---|---|---|---|
| Content [mass %] | Glass | 38 | 48 | 40 | 40 | 40 | 59 | 40 |
|  | Willemite filler | 10 | 10 | 24 | 29 | 34 | 21 | 24 |
|  | Alumina filler | 52 | 42 | 36 | 31 | 26 | 20 | 36 |
| Average particle diameter [μm] | Glass | 2.7 | 2.7 | 2.7 | 2.7 | 2.7 | 2.7 | 2.7 |
|  | Willemite filler | 2.5 | 2.5 | 2.5 | 2.5 | 2.5 | 2.5 | 0.3 |
|  | Alumina filler | 1.9 | 1.9 | 1.9 | 1.9 | 1.9 | 1.9 | 1.9 |
| Thermal expansion coefficient [ppm] |  | 4.0 | 3.9 | 3.8 | 3.7 | 3.6 | 3.8 | 4.3 |
| Three-point bending strength [MPa] |  | 232 | 270 | 273 | 267 | 253 | 243 | 245 |

Glass raw materials were prepared so as to have, in terms of mass %, 70% of $SiO_2$, 28% of $B_2O_3$, and 2% of $K_2O$, and the glass raw materials were put into a platinum crucible and melted at 1600° C. to obtain molten glass. The molten glass was fed between two water-cooled rotating rolls, and the molten glass was stretched to obtain film-shaped glass.

The glass thus obtained was crushed and classified to obtain a glass powder having an average particle diameter shown in Table 1.

12 parts by mass of acrylic resin, 3 parts by mass of plasticizer (benzyl butyl phthalate), and 35 parts by mass of solvent (toluene) were mixed and kneaded with 100 parts by mass of the prepared mixed powder such that the contents of the glass powder, the willemite powder, and the alumina powder were as shown in Table 1, and then a green sheet having a thickness of 150 μm was obtained by a doctor blade method. The average particle diameters of the willemite powder and the alumina powder are as shown in Table 1.

The green sheet was punched to obtain a circular green sheet formed body having a diameter of 20.32 cm (8 inches). Then, through holes having a diameter of 100 μm and an interval of 500 μm were formed in the green sheet formed body by a laser punching machine, and via conductors were embedded by printing. The interlayer electrodes and the electrode pads were formed by printing a conductive paste. Thereafter, the green sheet formed bodies were laminated, and alumina green sheets formed of the alumina filler were further laminated as a restraining member to prepare a laminated body.

Next, the laminated body was subjected to thermocompression bonding at 90° C. and 30 MPa. Thereafter, the laminated body was heat treated at 450° C. to be degreased, and then sintered at 850° C. to obtain a sintered body. The resulting sintered body was polished to remove a restraining member, thereby producing a ceramic circuit board having a thickness of 3.0 mm.

The thermal expansion coefficient and three-point bending strength of the produced ceramic circuit board were evaluated.

The thermal expansion coefficient in the temperature range of −40 to +125° C. was measured by a method in accordance with JIS R3102.

The three-point bending strength was measured by a method in accordance with JIS R1601.

As is clear from Table 1, Samples No. 1 to No. 6, which are Examples of the present invention, had a thermal expansion coefficient of 3.6 to 4.0 ppm/° C. in the temperature range of −40° C. to +125° C., which was substantially the same value as the thermal expansion coefficient of the semiconductor wafer. In addition, the three-point bending strength was 232 MPa to 273 MPa, which was sufficient strength. On the other hand, Sample No. 7, which is Comparative Example, had a thermal expansion coefficient of 4.3 ppm/° C., which was larger than the thermal expansion coefficient of the semiconductor wafer.

Next, when Samples Nos. 1 to 6, which are Examples, were used for a probe card, and a semiconductor wafer was inspected with the probe card in the temperature range of −40 to +125° C., the semiconductor wafer could be inspected without any problem. On the other hand, when Sample No. 7, which is Comparative Example, was used for a probe card, and a semiconductor wafer was inspected with the probe card in the temperature range of −40° C. to +125° C., the semiconductor wafer could not be accurately inspected due to expansion of the ceramic circuit board.

REFERENCE SIGNS LIST

1: Ceramic circuit board
10: Ceramic board
10a: First main surface
10b: Second main surface
11: Ceramic layer
20: Internal conductor
21: Interlayer electrode
22: Via hole electrode
31, 32: Electrode pad

The invention claimed is:

1. A ceramic circuit board comprising:
   a ceramic board; and
   an internal conductor disposed in the ceramic board,
   wherein the ceramic board contains glass, a willemite filler, and an alumina filler,
   an average particle diameter of the willemite filler is larger than an average particle diameter of the alumina filler, and
   a thermal expansion coefficient of the ceramic board is 4 ppm/° C. or less in a temperature range of −40° C. to +125° C.

2. The ceramic circuit board according to claim 1, wherein the ceramic board contains, in terms of mass %, 30% to 65% of the glass, 14% to 56% of the willemite filler, and 7% to 42% of the alumina filler.

3. The ceramic circuit board according to claim 1, wherein the glass is borosilicate glass.

4. The ceramic circuit board according to claim 3, wherein the borosilicate glass contains, as a glass composition, in terms of mass %, 60% to 80% of $SiO_2$, 10% to 30% of $B_2O_3$, 1% to 5% of $Li_2O+Na_2O+K_2O$, and 0% to 20% of $MgO+CaO+SrO+BaO$.

5. A ceramic green sheet for a ceramic circuit board comprising: in terms of mass %,
   30% to 65% of a glass powder;
   14% to 34% of a willemite filler; and
   7% to 42% of an alumina filler,
   wherein an average particle diameter of the willemite filler is larger than an average particle diameter of the alumina filler.

6. A glass ceramic powder for a ceramic circuit board comprising: in terms of mass %,
   30% to 65% of a glass powder;
   14% to 34% of a willemite filler; and
   7% to 42% of an alumina filler,
   wherein an average particle diameter of the willemite filler is larger than an average particle diameter of the alumina filler.

7. The ceramic circuit board according to claim 2, wherein the glass is borosilicate glass.

8. The ceramic circuit board according to claim 7, wherein the borosilicate glass contains, as a glass composition, in terms of mass %, 60% to 80% of $SiO_2$, 10% to 30% of $B_2O_3$, 1% to 5% of $Li_2O+Na_2O+K_2O$, and 0% to 20% of $MgO+CaO+SrO+BaO$.

* * * * *